United States Patent [19]

Amada et al.

[11] 4,427,951

[45] Jan. 24, 1984

[54] PROTECTIVE DEVICE FOR POWER AMPLIFIER

[75] Inventors: Nobutaka Amada; Harushige Nakagaki; Shigeki Inoue, all of Toyokawa, Japan

[73] Assignee: Hitachi, Ltd., Tokyo, Japan

[21] Appl. No.: 335,545

[22] Filed: Dec. 29, 1981

[30] Foreign Application Priority Data

Jan. 7, 1981 [JP] Japan ............................... 56-279
May 29, 1981 [JP] Japan ............................. 56-81011

[51] Int. Cl.³ .......................... H03F 3/04; H02H 7/20
[52] U.S. Cl. ...................................... 330/298; 330/51; 330/297
[58] Field of Search .................... 330/207 P, 297, 298, 330/51

[56] References Cited
U.S. PATENT DOCUMENTS 4,173,740 11/1979 Nagata et al. ..................... 330/298

*Primary Examiner*—James B. Mullins
*Attorney, Agent, or Firm*—Antonelli, Terry & Wands

[57] ABSTRACT

In a power amplifier having a power circuit of a switching control system, a protective device for the power amplifier has connected to the amplifier a means for detecting an abnormal signal produced at the amplifier, and a control means connected between the detecting means and the power circuit to the amplifier so as to cut off a switching control signal to the power circuit when an abnormal signal is generated at the amplifier, thereby stopping the power circuit from operating to cut off power to the power amplifier. The detecting means is formed of a detecting circuit connected to the output end of the amplifier so as to detect the DC output voltage or excessive current from the amplifier, and a driving circuit connected to the detecting circuit so as to be operated by the output signal from the detecting circuit. The control means is formed of a switching control signal cut off circuit connected between the driving circuit and the power circuit so as to be supplied with the output voltage or current from the detecting means when it detects the DC output voltage or excessive current from the amplifier, thereby cutting off the switching control signal cut-off circuit.

11 Claims, 13 Drawing Figures

F I G. 2
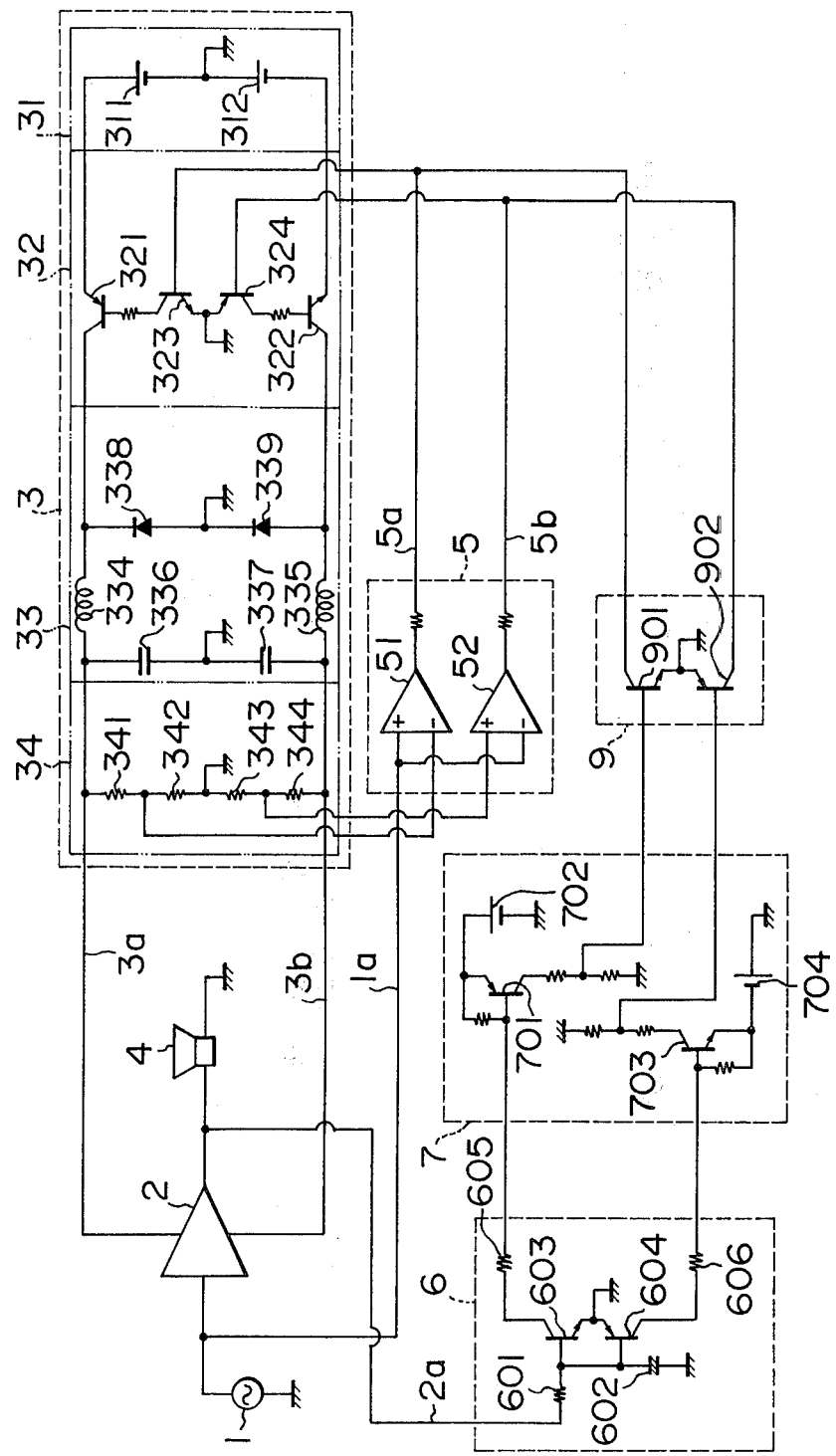

PROTECTIVE DEVICE FOR POWER AMPLIFIER

BACKGROUND OF THE INVENTION

This invention relates to a power amplifier, and particularly to a protective device for preventing a power amplifier for acoustic purpose from being brought into an abnormal condition, for example, generation of an abnormal voltage due to shorted load or the like, or failure due to transient abnormal sound upon turning-on and -off of power.

There has been proposed a protective means for preventing a power amplifier from breaking down due to an abnormal voltage, abnormal sound or the like, by providing a relay between the power amplifier and a loudspeaker and actuating the relay upon abnormal operation of the power amplifier to disconnect a signal path.

However, the relay must cut off a large current and thus becomes large in size. In addition, the proportion of the cost of the relay in the cost of the whole amplifier is large and ranks fourth in the proportions of costs of power transformer, heat sink, output transistor and relay which constitutes the amplifier. The cost of the relay occupies most of the cost of the protective device. In addition, only the use of a relay for cutting off output current is insufficient to protect the whole of the amplifier. That is, when a primary failure occurs due to some cause, for example, initial defect or shortcircuit between pattern conductors, secondary, ternary . . . failures are caused in turn like a chain reaction, and finally a large accident such as the emission of smoke or subsequent fire may occur. Even if such a large accident does not occur, the first failure may extended further. It is desirable to restrict the first failure, if it occurs, such that it will not cause secondary and ternary failures.

In short, the conventional protective means has drawbacks that use of a relay leads to high cost and that secondary and ternary failures cannot be prevented.

SUMMARY OF THE INVENTION

It is an object of this invention to provide a protective device for a power amplifier which needs no relay and does not cause secondary and ternary failures.

In order to achieve the above object of the invention there is provided a circuit means for detecting an abnormal condition of an apparatus and for generating a detection signal for cutting off a switching control signal which is used in controlling the source voltage to a power amplifier to vary in association with an input signal, thereby stopping the supply of a source voltage to the power amplifier.

In accordance with this invention, a useful protective device can be realized which employs no large and expensive relay and is able to protect a power amplifier and not to cause secondary and ternary failures with the results that the reliability of the amplifier can be improved.

BRIEF DESCRIPTION OF THE DRAWINGS

FIG. 2 is a circuit diagram of a specific example of the embodiment.

DESCRIPTION OF THE PREFERRED EMBODIMENTS

Figure 1:
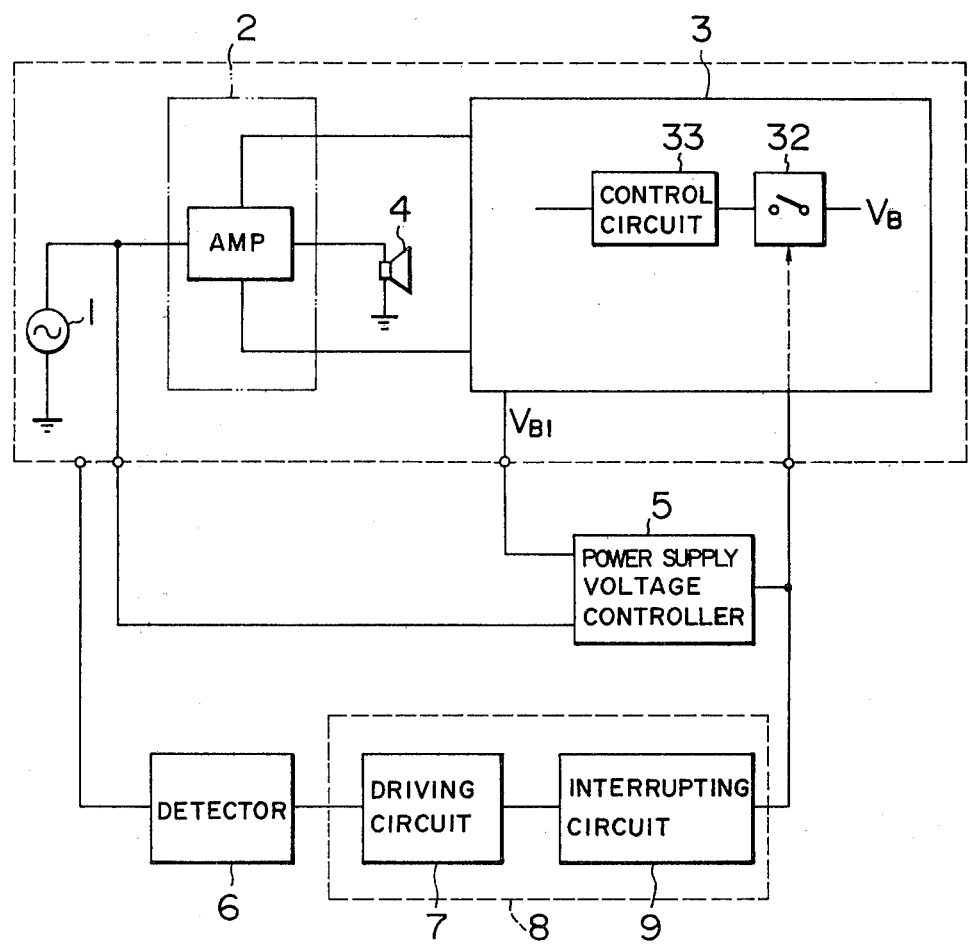
FIG. 1 is a block diagram of an embodiment of this invention.

An embodiment of the invention will hereinafter be described with reference to the drawings. FIG. 1 is a block diagram of an embodiment of the invention. Referring to FIG. 1, there are shown an input signal source 1, a power amplifier 2 including an output transistor, a power circuit 3 therefor, and a loudspeaker 4. These circuit elements constitute a generally known power amplifier system. Shown at 5 is a supply voltage control means for varying the supply voltage from the power circuit 3 in response to the input signal. This control means serves to compare the input signal from the input signal source 1 and a reference signal, for example, a supply voltage $V_{B1}$ from the power circuit 3 and then control a switching circuit portion 32 of the power circuit 3 to turn on and off by its output. Consequently, a control circuit 33 for the power circuit 3 generates a control signal which causes the supply voltage to the power amplifier 2 from the power circuit 3 to be changed in response to the input signal. The fact that the supply voltage from the power circuit 3 or the supply voltage to the power amplifier 2 is changed in response to the input signal is well known as disclosed in, for example, Japanese Patent Application Laid-Open No. 44857/76. This technique permits improvement of power efficiency. Shown at 6 is a detecting circuit for detecting an abnormal condition of the power amplifier system and detecting an abnormal signal at this time, and 8 a circuit which is responsive to the detected signal from the detecting circuit 6 when an abnormal condition occurs in the power amplifier system, to control the control circuit 5 to cut off the supply voltage. This circuit 8 includes a driving circuit 7 to which an abnormal condition detected signal is applied, and an interrupting circuit 9 connected to the driving circuit 7 and which serves to cut off the power switching control signal from the control circuit 5 when an abnormal condition occurs in the power amplifier system.

A specific example thereof will be described with reference to FIG. 2. FIG. 2 is an example for preventing the power amplifier system from breaking down by an abnormal voltage occuring at the output terminal of the power amplifier system. In this circuit arrangement, the power circuit 3 includes a fixed power supply portion 31, a switching circuit portion 32 having transistors 321, 322, 323, 324 and others, and a low-pass filter 33 having choke coils 334 and 335, capacitors 336 and 337 and others. The control circuit 5 includes comparators 51 and 52, which compare the input signal from the input signal source 1 and divided source voltages between resistors 341 and 342, 343 and 344, of the power circuit 3, to produce compared outputs by which the transistors 323 and 321, 324 and 322 are switched to control the supply voltage to vary in response to the input signal. For example, the comparator 51 of the control circuit 5 compares the input from the input signal source 1 and the divided voltage between the resistors 341 and 342 of a voltage dividing circuit portion 34 of the power circuit 3, or the positive supply voltage of the power amplifier 2, and switches the transistors 321 and 323 of the switching circuit portion 32. In other words, when the positive supply voltage divided between the resistors 341 and 342 is smaller than the input signal, the transistors 321 and 323 are turned on to increase the positive supply voltage, whereas when it is larger than the input signal, the transistors 321 and 323 are turned off to decrease the positive supply voltage, thus the supply voltage of the power circuit 3 being changed in proportion to the input signal. While in the above embodiment, the supply voltage of power circuit 3 is used as the reference signal to the comparators 51 and 52, the reference signal may be supplied from a separate circuit.

Figure 3:
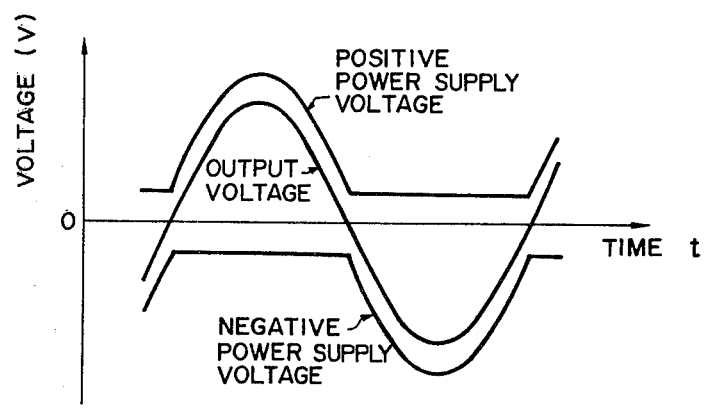
FIG. 3 is a waveform diagram useful for explaining the operation thereof.

FIG. 3 is a waveform diagram illustrative of control of the supply voltage to the power amplifier. The supply voltage is changed, being shifted by a constant voltage from the output voltage of the power amplifier 2, by properly selecting the voltage dividing ratio between the resistors 341 and 342. The negative supply voltage is obtained as shown in FIG. 3 by the operation of the comparator 52. Therefore, since the operating output transistor is always supplied with a constant voltage, the loss is decreased to improve the power efficiency. The detecting circuit 6 is supplied with, for example, the DC output voltage to be detected, and attenuates its AC components by a resistor 601 and a capacitor 602 to produce only a DC component. When a positive DC output voltage is produced at the output end of the amplifier 2, a transistor 603 is turned on, while when a negative DC output voltage is produced thereat, a transistor 604 is turned on, thus turning on a transistor 701 or 703. In this case, when the transistor 701 is turned on, a transistor 901 of a switching signal cut-off circuit 9 is turned on, permitting a control signal from the control circuit 5 to be passed through the transistor 901 to ground, thereby stopping the control signal from being transmitted to the power circuit 3. Accordingly, the transistor 321 is turned off to stop the positive variable supply voltage to the amplifier 2. When a negative DC output voltage is produced, the transistors 604, 703 and 902 are turned on to turn off the transistors 324 and 322, thereby stopping the negative variable supply voltage to the amplifier 2.

The generation of DC output voltage at the output end of the amplifier 2 means that a failure takes place in the interior circuit of the amplifier 2 because the musical signal inputted to the amplifier 2 includes no DC components and therefore the DC output voltage is not produced as long as the amplifier 2 operates normally. However, even if a failure occurs in the interior circuit of the amplifier 2, the power source associated with the failure is stopped from supplying power to the amplifier 2, so that not only the DC output voltage is removed, but the defective portion does not extend in a chain reaction.

As described above, according to the method of cutting off of the switching control signal for controlling the supply voltage of the power circuit 3, the operation of the variable power circuit 3 is interrrupted and thus the power is not supplied to the amplifier 2, so that not only the loudspeaker 4 but the interior circuits of the power circuit 3 and amplifier 2 are protected. If a primary failure takes place, secondary and ternary failures are prevented from occurring. Moreover, since no relay is required, the cost is reduced.

Figure 4:
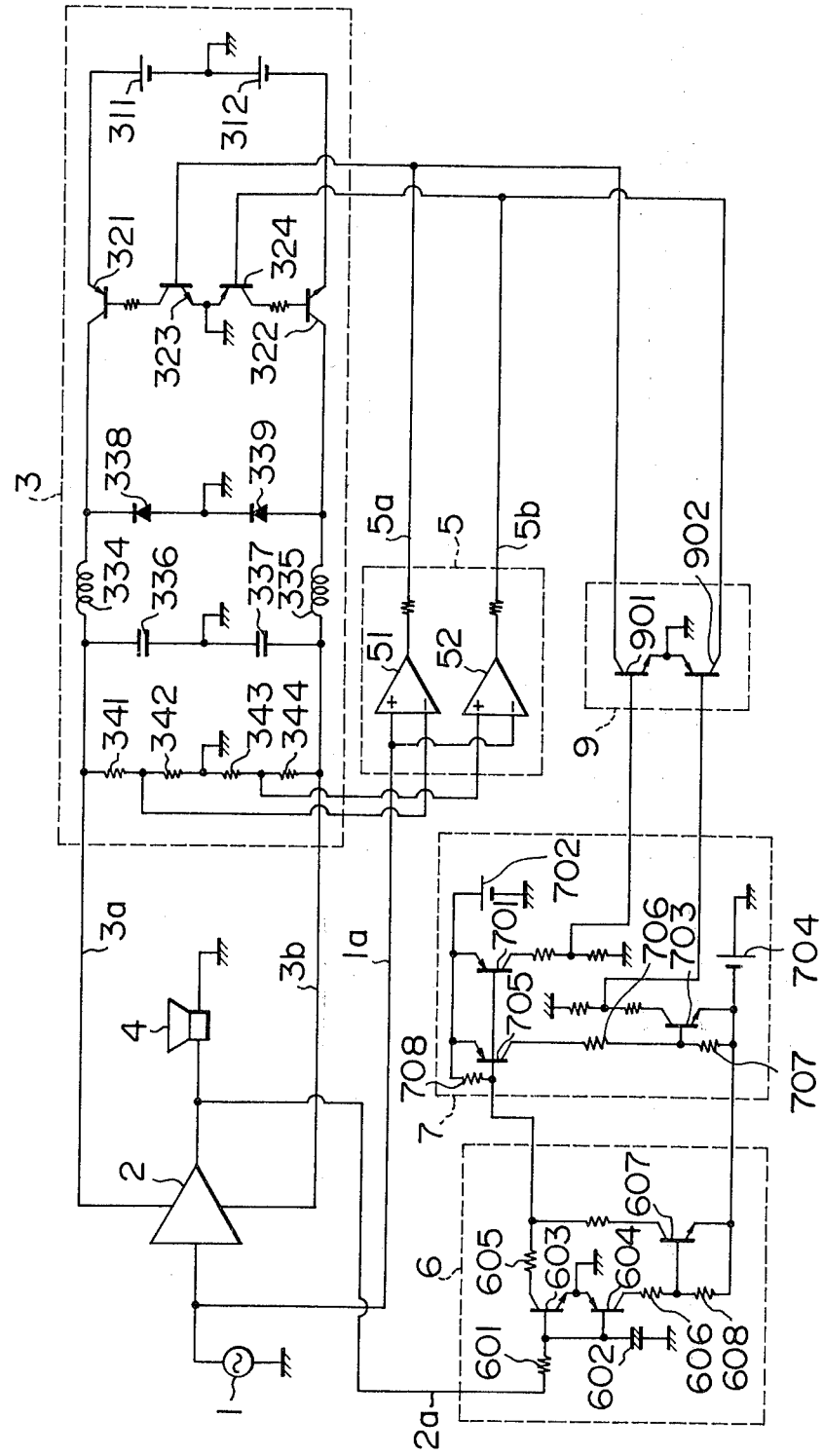
FIG. 4 is a circuit diagram of an improvement of the arrangement of FIG. 2.

FIG. 4 shows an improved circuit arrangement of FIG. 2. The difference in FIG. 4 from FIG. 2 consists in the detecting circuit 6 and the driving circuit 7. In other words, the transistor 603 is turned on by the positive DC output voltage, while transistors 604 and 607 are turned on by the negative DC output voltage. In either case, transistors 701 and 705 are turned on. When the transistor 701 is turned on, the transistor 901 is turned on, cutting off the positive control signal. At the same time, the transistor 705 is turned on to make the transistors 703 and 902 conductive thereby cutting off the negative control signal. Thus, the feature of this circuit arrangement is that the positive and negative supply voltages are cut off at a time independently of the polarity of the DC output voltage to completely prevent secondary and ternary failures from occurring.

Figure 5:
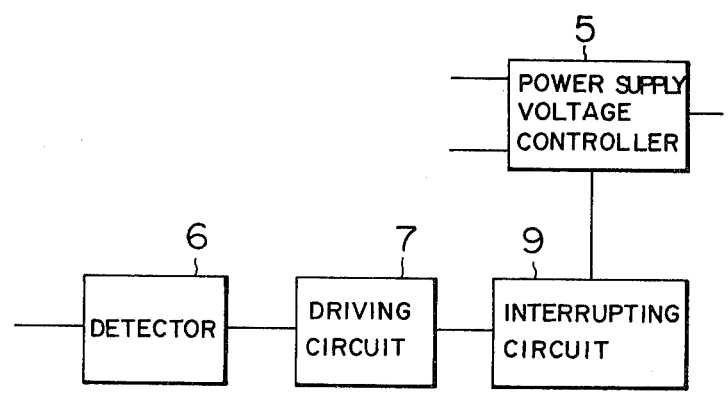
FIG. 5 is a block diagram of an application of FIG. 2.
Figure 6:
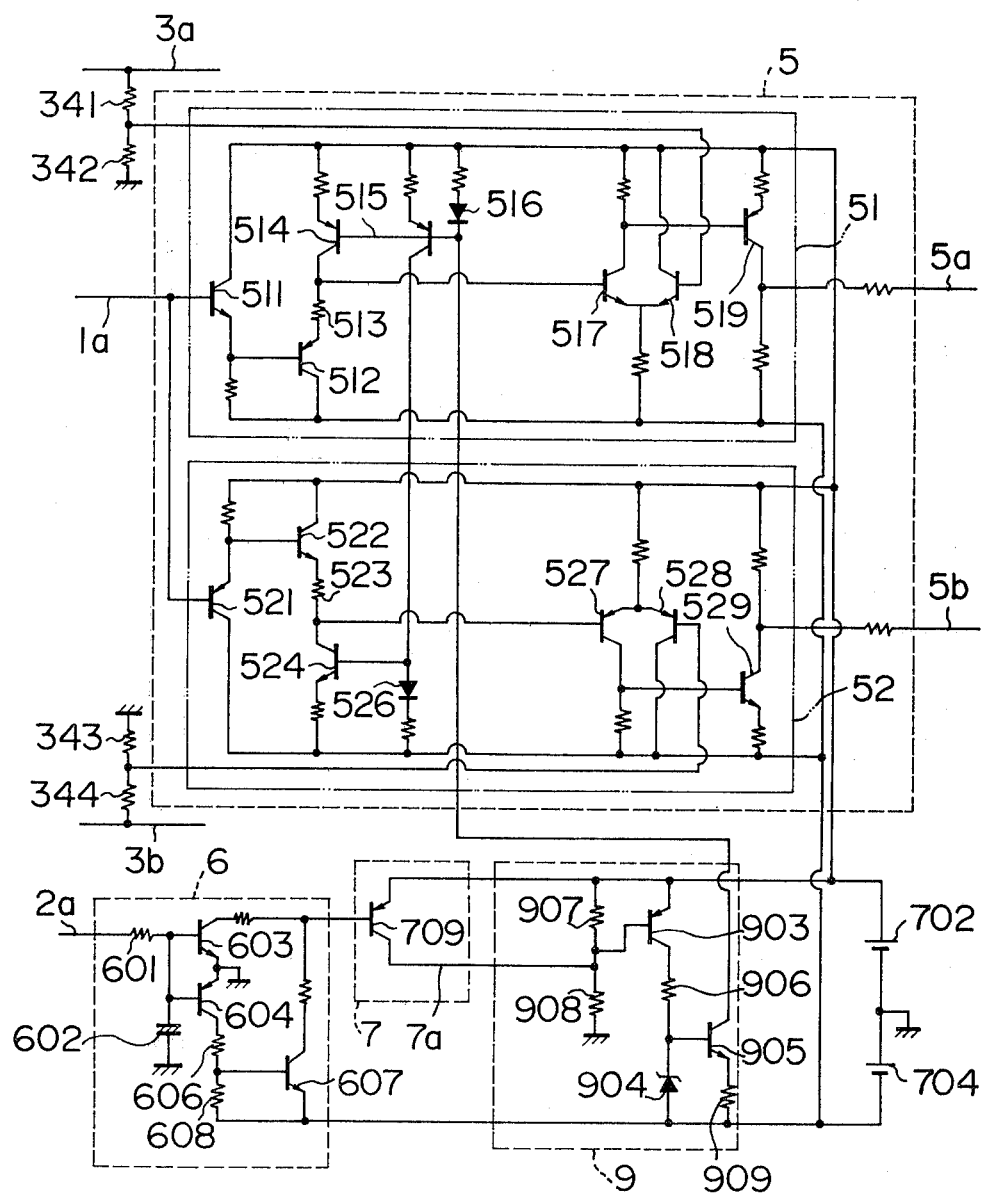
FIGS. 6 to 8 are circuit diagrams of specific examples thereof.

FIGS. 5 and 6 show an application of this invention, and only different portions from FIGS. 2 and 4. In FIG. 6, the comparators 51 and 52 constituting the switching control circuit 5 include input voltage shifting portions of transistors 511 and 512 and a resistor 513, and transistors 521 and 522 and a resistor 523, and differential amplifier portions of transistors 517, 518 and 519, and transistors 527, 528 and 529, respectively. This voltage shifting portion serves to supply a constant voltage to the amplifier 2 even at the time of no signal. Even at the time of signal input, the supply voltage is changed, being shifted by this constant voltage from the output voltage. Thus, the output transistor is always supplied with only this constant voltage. If this voltage is selected as small as possible, the loss at the output transistor can be remarkably reduced.

In addition, the transistors 514, 524 and 515 and diodes 516, 526 of the control circuit 5, and a transistor 905 and diode 904 of the control signal interrupting circuit 9 constitute a constant current circuit for determining the shift voltage. The transistor 905 and diode 904 constitute the switching control signal interrupting circuit 9. In other words, when a detected signal from the detecting circuit 6 is applied to the driving circuit 7, irrespective of the polarity of the DC output voltage, the driving transistor 709 is turned on to make the transistors 903 and 905 nonconductive, interrupting the constant current circuit. Thus, the transistors 514 and 524 of the control circuit 5 are turned off. Then, the base currents do not flow to the transistors 517 and 527 of the differential amplifier portion of the control circuit 5, which are thus turned off.

As a result, the transistors 519 and 529 are turned off to interrupt the control signal.

Thus, the feature of the circuit arrangement of FIGS. 5 and 6 is that the control signal is not interrupted directly, but the control signal is indirectly interrupted by cutting off the bias to the comparators 51 and 52, and therefore the circuit arrangement can be simplified.

The circuit arrangements shown in FIGS. 2, 4 and 6 can prevent the abnormal condition of the power amplifier system by cutting off the switching control signal, but at this time the detected signal also disappears and thus the control signal is released from the interruption. Consequently, the amplifier 2 is again supplied with power, so that the interruption and release therefrom, of the control signal are periodically repeated.

Figure 7:
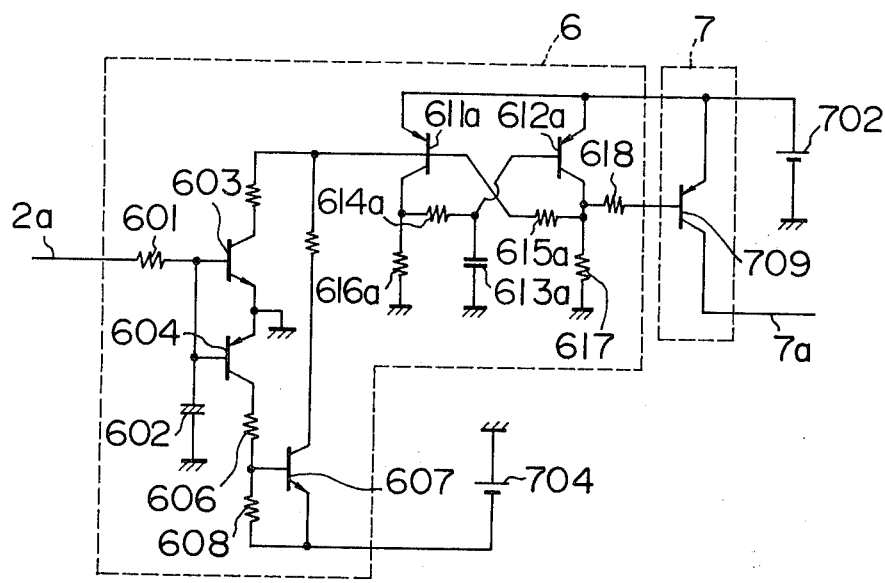

FIG. 7 is a circuit diagram of an embodiment of this invention with the drawback obviated. The detecting circuit 6 is constructed as illustrated, and the detected signal is latched by a flip-flop of transistors 611a and 612a. In other words, at the initial condition, the transistor 612a is always conductive and the transistor 611a nonconductively by a capacitor 613a. When an input signal is applied, the transistor 611a is turned on and the transistor 612a off. When the transistor 612a is turned off, the transistor 709 constituting the next driving circuit 7 is turned on, finally interrupting the control signal. This condition continues after the detected signal disappears, by the function of the flip-flop. Thus, the above problem is not caused.

While in the above embodiment the protective device for the power amplifier is described of the type in which the supply voltage of the power circuit is changed by controlling the secondary circuit of the power circuit, this invention is not limited to this embodiment but can be applied to the protective device for the power amplifier of a primary control system or using a fixed switching regulator. For the power amplifier using the fixed switching regulator, the protective device is constructed to stop the switching of the regulator when the amplifier is brought into an abnormal condition.

Figure 8:
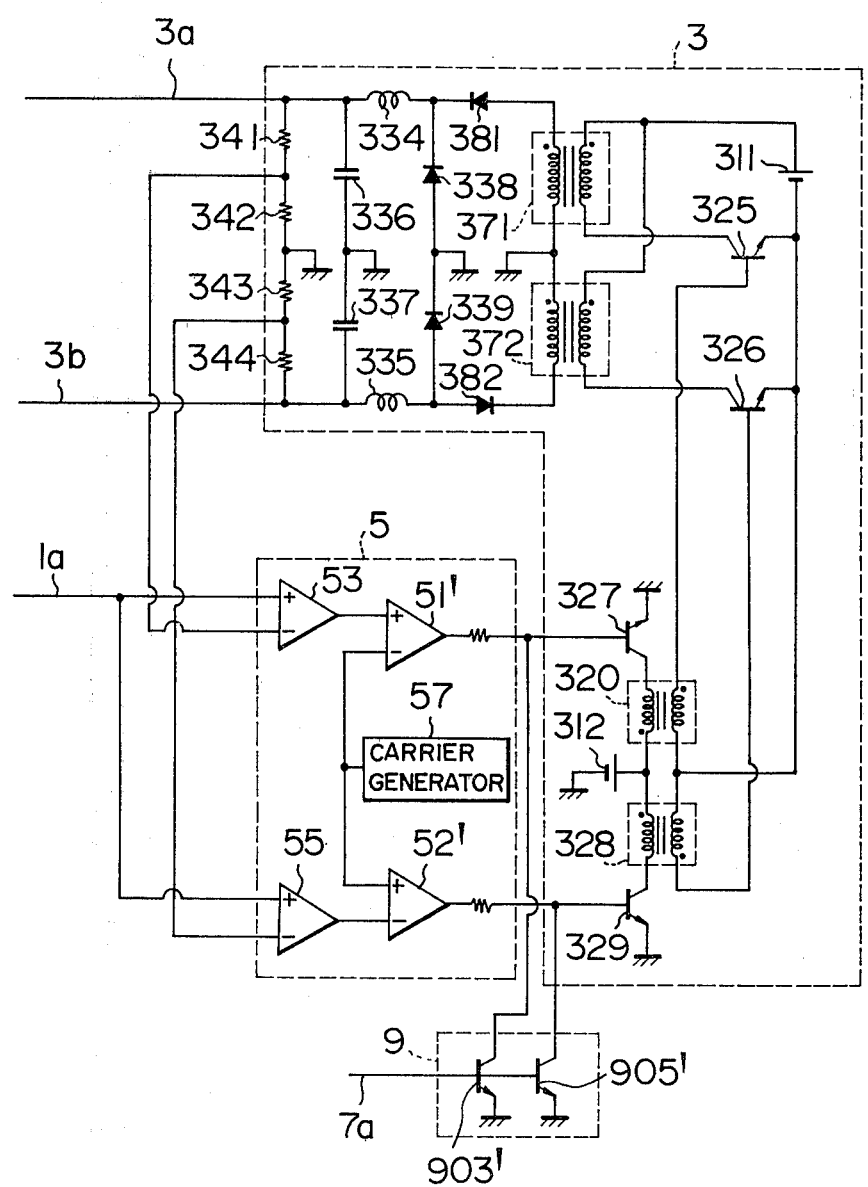

FIG. 8 is a circuit diagram of such embodiment, in which like portions corresponding to those of FIG. 4 are omitted. In FIG. 8, power supplies 311 and 312, high-frequency transformers 371 and 372, switching transistors 325 and 326, diodes 381, 382, 338 and 339, choke coils 334 and 335, capacitors 336 and 337, pulse transformers 320 and 328, and transistors 327 and 329 constitute the variable portion of the power circuit 3. The control circuit 5 constituted by error amplifiers 53 and 55, comparators 51' and 52' and a carrier oscillator 57, produces a PWM control signal to control the power circuit 3. The PWM control signal is interrupted by transistors 903' and 905' of the control signal interrupting circuit 9, and thereby the power circuit 3 is stopped from operation.

Figure 9:
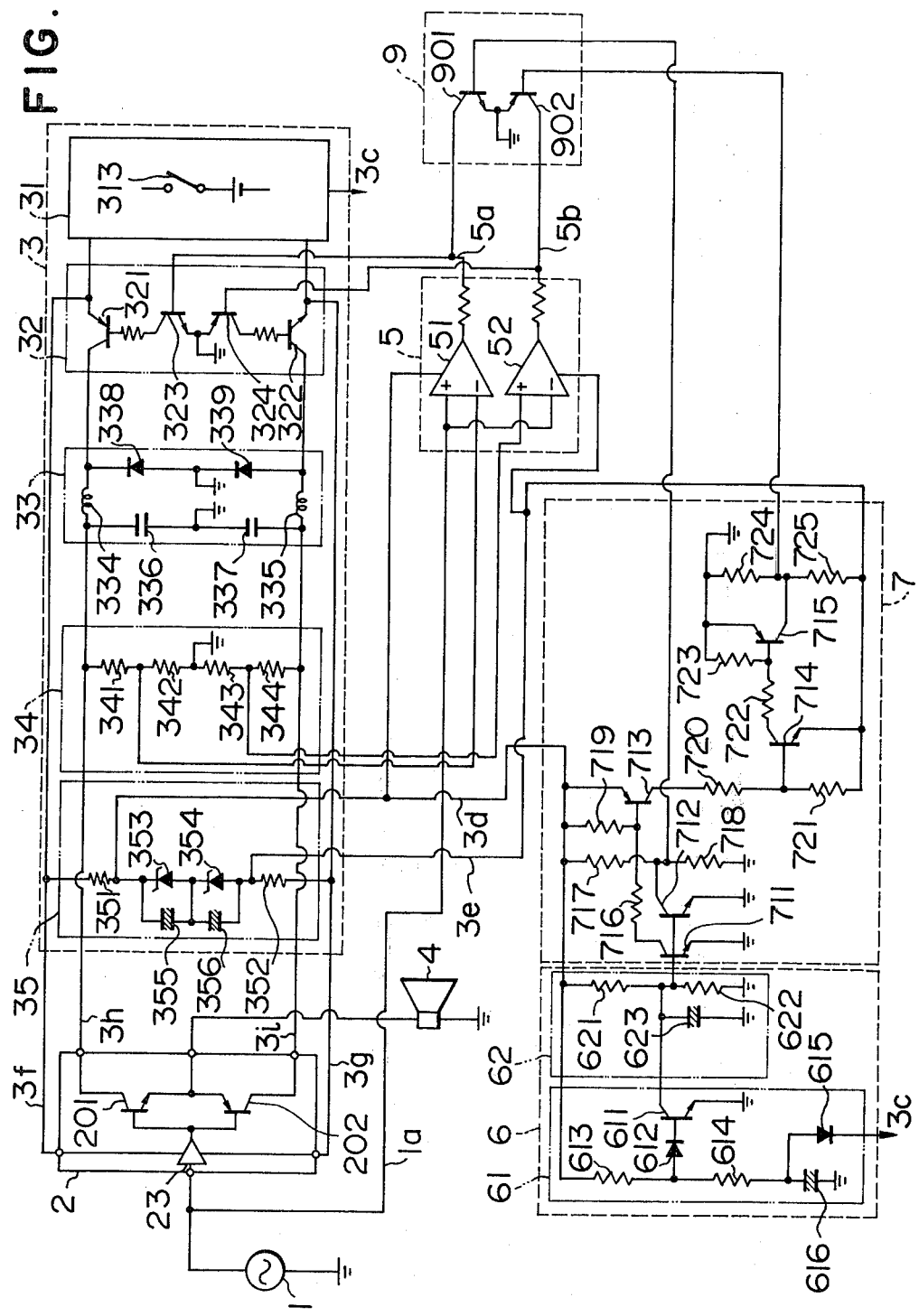
FIG. 9 is a circuit diagram of another specific example of FIG. 1.

FIG. 9 is a circuit diagram of another specific example of FIG. 2. This circuit arrangement prevents the power amplifier system from breaking down by abnormal sound generated when the power source for the power amplifier system is turned on and off. In FIG. 9, there are shown the input signal source 1, the power amplifier 2 including output transistors, the power supply 3 circuit therefor, the fixed power supply portion 31, the switching circuit portion 32, the low-pass filter 33, the voltage dividing circuit 34, the biasing supply portion 35, the loudspeaker 4, the switching control circuit for controlling the supply voltage of the power circuit 3 in accordance with the input signal, and the detecting circuit 6 for detecting an abnormal condition, or abnormal sound generated when the power source is turned on and off. The detecting circuit is formed of a quick discharge circuit 61 and a charge time constant circuit 62. Shown at 7 is the driving circuit, and 9 the switching control signal cut-off circuit.

The operation of the circuit arrangement of FIG. 9 will be described with reference to FIG. 10.

Figure 10:
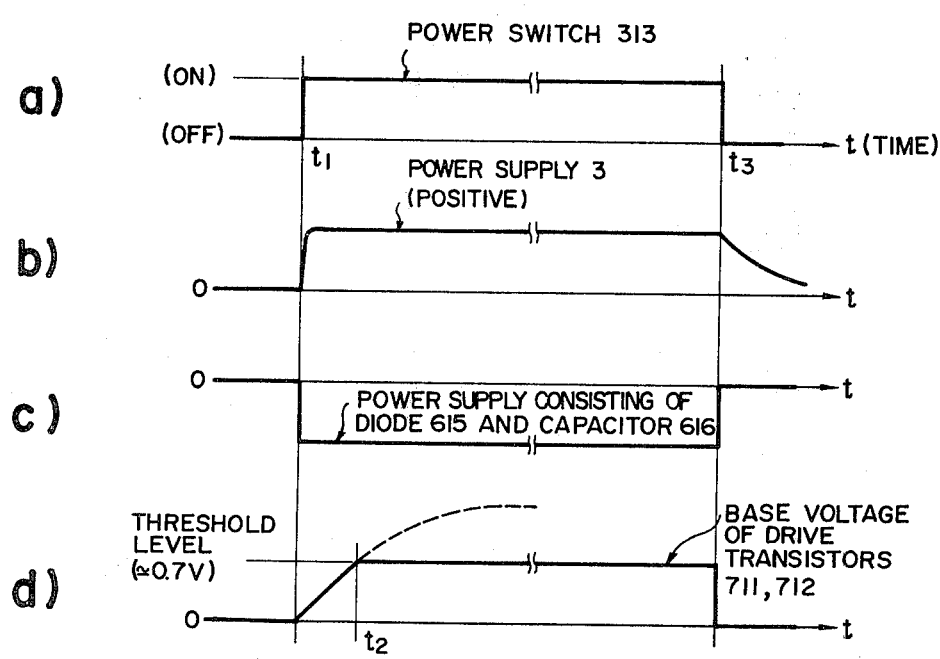
FIG. 10 is a waveform diagram useful for explaining the operation thereof.

FIG. 10 is a timing chart of the operation of the circuit arrangement.

When the power switch 313 is turned on at time $t_1$ in FIG. 10a, the power of the power circuit 3 is supplied to the power amplifier 2 via lines 3f and 3g at approximately the same time. The base voltage of the transistors 711 and 712 of the drive circuit 7 gradually rises depending on the time constant of the resistors 621 and 622 and capacitor 623 of the charge time constant circuit 62. Thus, the transistors 711 and 712 remain in the off-state until the base voltage reaches a threshold level at which the transistors 711 and 712 are turned on, and therefore the transistors 713, 714 and 715 are also in the off-state. During this period of time, the transistors 901 and 902 of the control signal cut-off circuit 9 are turned on to make the transistors 323, 324 and 321, 322 constituting the switching circuit portion 32 of the power circuit 3 turn off irrespective of whether the comparators 51 and 52 of the control circuit 5 produce output or not. Consequently, the output transistors 201 and 202 are not powered during this period of time, thus producing no abnormal voltage to the loudspeaker 4. When current flows to the capacitor 623 to charge it more and as a result the voltage thereacross reaches the threshold level of the transistors 711 and 712 of the driving circuit 7, the transistors 711 and 712 are turned on, and then the transistors 712 and 715 are turned on. Turning-on of the transistors 712 and 715 causes the transistors 901 and 902 of the cut-off circuit 9 to be nonconductive, thus releasing the switching circuit portion from the nonconductive state as set forth above. Therefore, the output transistors 201 and 202 of the power amplifier 2 are powered via the switching circuit portion 32 of the power circuit 3, so that the power amplifier normally operates.

When the switch 313 is turned off, the charge in the small capacitor 616 of the quick discharge circuit 61 is rapidly discharged through the resistors 613 and 614, and as a result the diode 612 and the transistor 611 are turned on to cause the capacitor 623 of the charge time constant circuit 62 to rapidly discharge and at the same time the transistors 712, 711, 713, 714 and 715 to turn off. In addition, the transistors 901 and 902 of the cut-off circuit 9 are turned off to cut off the switching control signal of the control circuit 5. Accordingly, the power circuit 3 stops its operation substantially at the same time the switch 313 is turned off, resulting in no power being supplied to the transistors 201 and 202. Thus, the loudspeaker 4 emanates no residual sound or the like.

The means for cutting off the switching control signal handles no large current such as output current, and therefore may be a semiconductor switch as shown in FIG. 9, which leads to lower cost.

Figure 11:
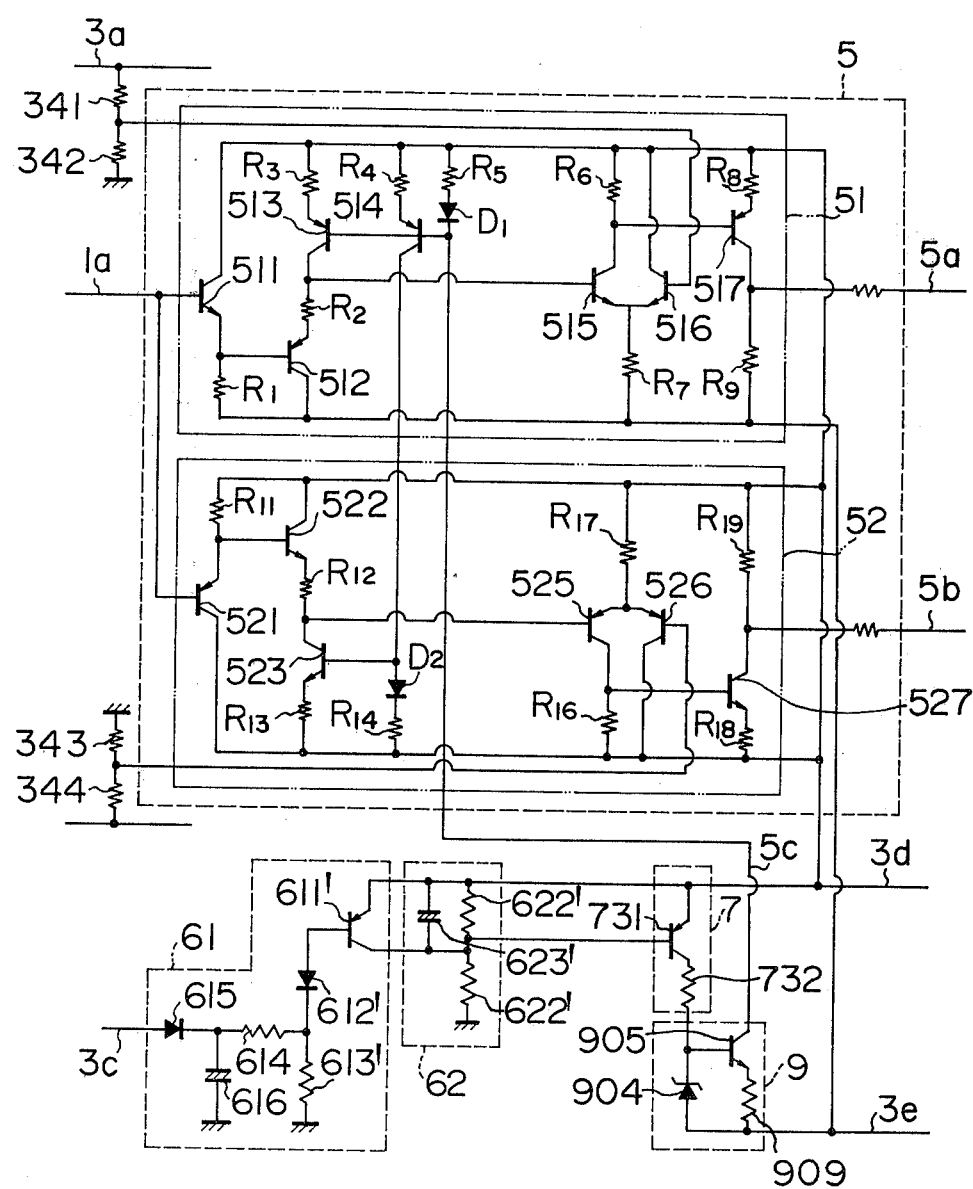
FIGS. 11 to 13 are circuit diagrams of an improvement of FIG. 9.

FIG. 11 is an example in which positive and negative switching control signals are cut off at a time by a single semiconductor switch, and in FIG. 11 is shown only the portion different from the arrangement of FIG. 9. The comparators 51 and 52 constituting the switching control circuit 5 are each formed of an input voltage shift portion having transistors 511 and 512 and resistors $R_1$ and $R_2$ or transistors 521 and 522 and resistors $R_{11}$ and $R_{12}$, and a differential amplifier having transistors 515, 516 and 517 and resistors $R_7$, $R_6$, $R_8$ and $R_9$ or transistors 525, 526 and 527 and resistors $R_{17}$, $R_{16}$, $R_{18}$ and $R_{19}$. This input voltage shift portion serves to supply a constant voltage to the output transistors 201 and 202 of the power amplifier 2 even when no signal is applied, and when a signal is inputted, the supply voltage changes, being shifted by this constant voltage from the output voltage. Therefore, only this constant voltage is always applied to the output transistors 201 and 202. If this voltage is selected as small as possible, the loss at the output transistors 201 and 202 can be remarkably reduced.

The transistors 513, 514 and 523, diodes $D_1$ and $D_2$, and resistors $R_3$, $R_4$, $R_5$, $R_{13}$ and $R_{14}$ and the Zener diode 904 and resistor 909 of the cut-off circuit 9 constitute a constant current circuit for determining this shift voltage. The transistors 905, Zener diode 904 and resistor 909 also constitute the switching control signal cut-off circuit 9. That is, when the power switch 313 is turned on and off, the charge time constant circuit 62 or quick discharge circuit 61 mutes the signal, at which time the drive transistor 731 is turned off, the transistor 905 is turned off and the transistors 513 and 523 are turned off as a result of cutting off of the constant current circuit. At this time, since no base current flows to the transistors 515 and 525, these transistors are turned off and the transistors 517 and 527 are turned off to cut off the control signal.

The muting operation will hereinafter be described. When the switch 313 is turned on to actuate power supply, the capacitor 623' constituting the time constant circuit 62 operates to make the transistor 731 nonconductive for a certain period of time as in the circuit arrangement of FIG. 9. Since no current flows in the Zener diode 904 while the transistor 731 is in the off-state, the transistor 905 is turned off, cutting off the switching control signal as described above. Thus, in this period of time, the power circuit 3 stops its power changing operation, the output transistors 201 and 202 are not powered, and the loudspeaker 4 is supplied with no abnormal voltage. When the switch 313 is turned off to disconnect power supply, the transistors 903 and 905 are, similarly as in the circuit arrangement in FIG. 9, turned off by the operation of the quick discharge circuit 61 to cut off the switching control signal, thus the power supply circuit 3 stopping its power changing operation to prevent the loudspeaker 4 from being supplied with abnormal voltage.

Thus, the feature of the circuit arrangement of this invention is that the control signal is not directly cut off, but the positive and negative control signals are indirectly cut off at a time by stopping bias to the comparators 51 and 52, thus the circuit arrangement is simplified.

In the circuit arrangements of FIGS. 9 and 11, the voltage amplifier 2 is powered even if power is not supplied to the output transistors 201 and 202, and therefore if an input signal is applied to and amplified at the amplifier, the signal voltage will be applied via the base-emitter diode of the output transistors 201, 202 to the loudspeaker 4. However, since the output transistors 201, 202 are usable to amplify the input signal, signal current larger than the maximum current which the voltage amplifier 23 can supply do not flow in the loudspeaker 4, or the signal voltage is very small, although it could be detected as a residual sound by a high-efficiency loudspeaker.

Figure 12:
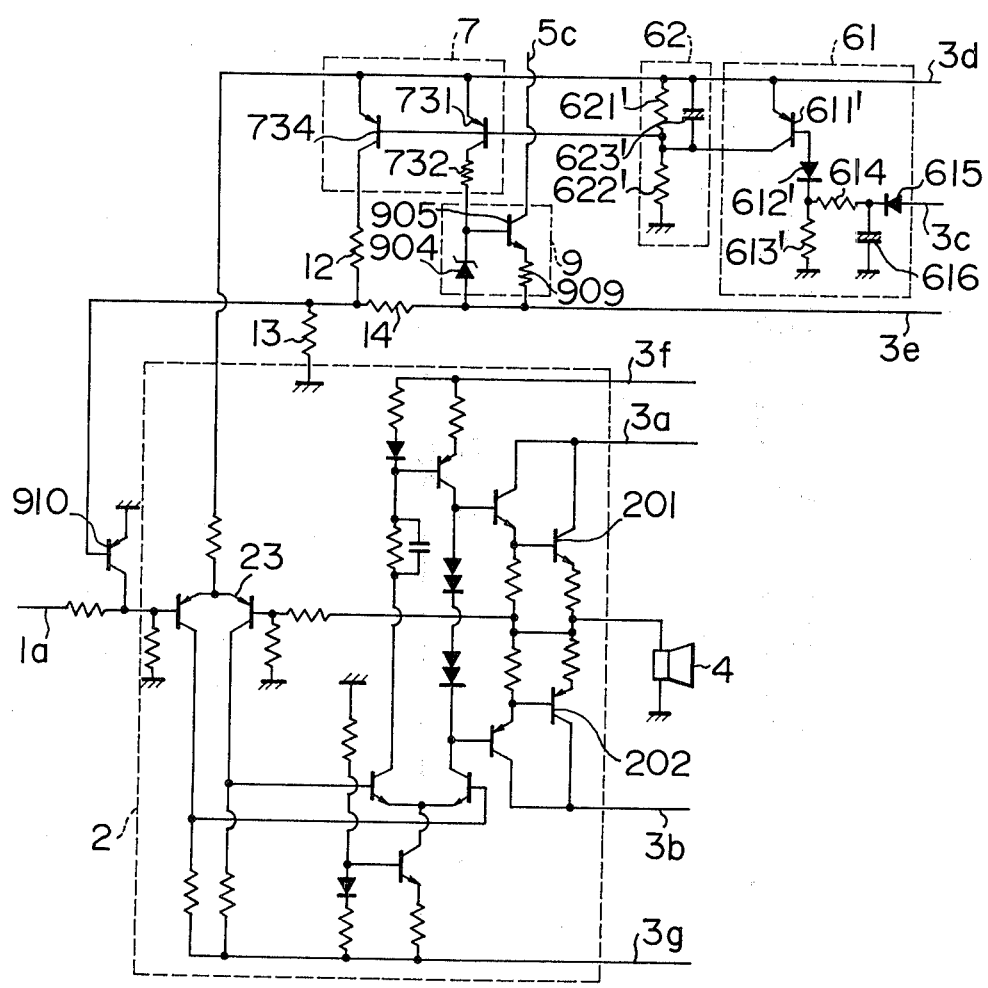

FIG. 12 is another embodiment of the invention with this drawback obviated, and there is shown only a different portion from those of FIGS. 9 and 11. The feature of this circuit arrangement is that upon muting of signal, the switching control signal is cut off to stop the operation of the power circuit 3 and at the same time to cut off the input signal. The operation of this circuit will be described in detail.

In FIG. 12, when power, for example, is switched on, the transistor 905 is turned off for a certain time by the operation of the time constant circuit 62 similarly as in FIGS. 9 and 11, cutting off the switching control signal to stop the power circuit 3 from changing its voltage. At this time, the transistor 734 as well as transistor 731 is turned off. When the transistor 734 is conductive, the base-emitter junction of the transistor 910 is forward-biased by the resistors 14 and 13, and thus turned on to cut off the input signal to the power amplifier 2, resulting in any such situation being avoided. After a certain time, muting of the signal is stopped, and thus the transistor 731 is turned on to make the power circuit 3 operative. At the same time, the transistor 734 is turned on and thus the transistor 910 is reverse-biased through the resistor 12, turning off with the result that an input signal is applied to the power amplifier 2.

When power is switched off, similarly as in FIGS. 9 and 11 the transistors 731 and 734 are turned off by the quick discharge circuit 61 to stop the operation of the power circuit 3 and at the same time the transistor 910 is turned on to cut off the input signal.

Thus, the switching control signal and input signal are cut off at one time, thereby solving the residual sound problem.

While in FIG. 12 the input signal is directly cut off, this invention is not limited to this method, but the input signal may be indirectly cut off by stopping bias to the voltage amplifier.

While in the above embodiments the muting circuit for the power amplifier is arranged to control the secondary of the power circuit 3, this invention may be applied to the primary control system.

Figure 13:
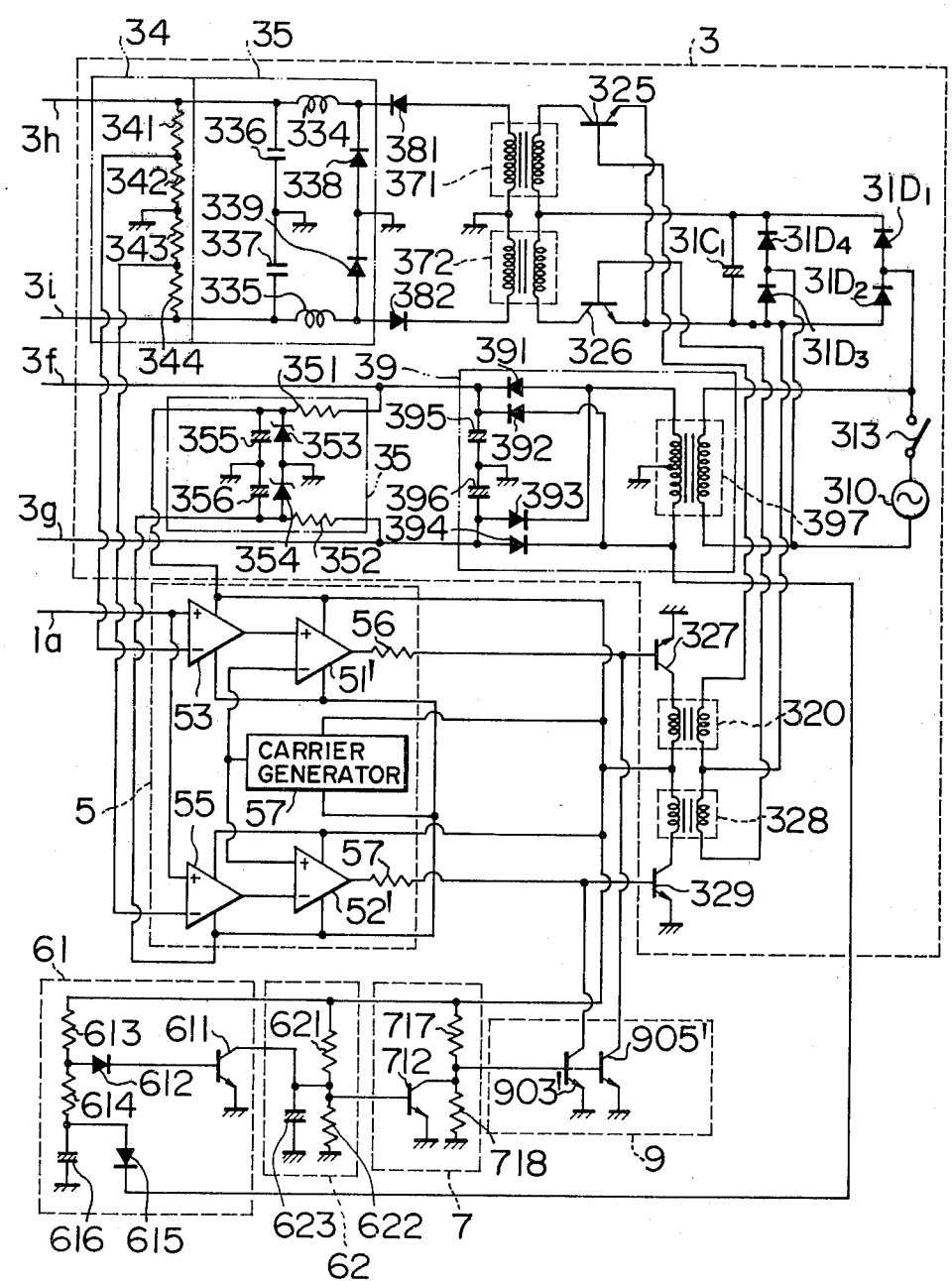

FIG. 13 shows one example thereof, in which portions common to those of FIGS. 9, 11 and 12 are omitted. In FIG. 13 the power circuit 3 is formed of a smoothing circuit including diodes $31D_1$, $31D_2$, $31D_3$ and $31D_4$ and a capacitor $31C_1$ to rectify a commercial frequency AC signal 310, a switching circuit including switching transistors 325 and 326, high-frequency transformers 371 and 372, diodes 381, 382, 338 and 339, choke coils 334 and 335, capacitors 336 and 337, pulse transformers 320 and 328, transistors 327 and 329 and so on. The control circuit 5 is formed of error amplifiers 53 and 55, comparators 51' and 52' and a carrier oscillator 57 for generating a reference signal. This control circuit 5 produces a PWM control signal in response to the input signal to control the power circuit 3. This PWM control signal is cut off by the transistors 905' and 903' to stop the power circuit 3, thereby realizing the muting operation.

The operation of this circuit arrangement will be described. When the switch 313 is turned on to connect a power source, similarly as in FIGS. 9, 11 and 12 the transistor 712 of the driving circuit 7 is turned off for a certain time by the time constant circuit 62. At this time, the transistors 905' and 903' are turned on by the resistors 717 and 718, and the transistors 327 and 329 are turned off to cut off the switching control signal from the comparators 51 and 52. Then, the switching transistors 325 and 326 are also made nonconductive to stop the power circuit 3 from operating with the results that no abnormal voltage is applied to the loudspeaker 4. When the switch 313 is opened to disconnect the power source, similarly as in FIGS. 9, 11 and 12 the transistor 712 is turned off by the quick discharge circuit 61, and the transistors 905' and 903' are turned on to cut off the switching control signal from the control circuit 5, stopping the power supply circuit 3 from changing its voltage to prevent the loudspeaker from being supplied with abnormal voltage.

In this circuit arrangement, the power source 39 using a transformer is required as a biasing circuit for the voltage amplifier 23 and control circuit 5, but since power consumption in these circuits is very small, the transformer 937 used is of a small capacity.

We claim:

1. In a power amplifier system having an amplifier for amplifying an input signal applied to its input terminal and producing the amplified signal at its output, a power circuit coupled to said amplifier to supply a supply voltage to said amplifier, and a control circuit coupled to said amplifier and said power circuit to generate a supply voltage control signal for changing said supply voltage in response to said input signal, a protective device for said power amplifier system comprising:

a detecting means coupled to said power amplifier system to detect, when an abnormal signal is generated in said power amplifier system, said abnormal signal; and a cut-off means supplied with the output from said detecting means to cut off the control signal from said control circuit thereby stopping said power supply circuit from changing its power source and supply power to said power amplifier.

2. A protective device according to claim 1, wherein said detecting means has a detecting circuit connected to the output end of said amplifier to detect a DC output voltage, or an excessive current from said amplifier, and said cut-off means has a driving circuit coupled to said detecting circuit to be actuated by the output signal from said detecting circuit and a switching control signal cut-off circuit connected between said driving circuit and said power circuit to be supplied with the detected output or current from said detecting circuit via said driving circuit when the DC output voltage or excessive current from said amplifier is detected by said detecting circuit, thereby cutting off a switching control signal from said power circuit.

3. A protective device according to claim 2, wherein said detecting circuit is formed of a transistor circuit including a first transistor connected to the output stage of said amplifier to turn on when a positive DC output voltage is caused at said output stage, and a second transistor connected to said stage to turn on when a negative DC output voltage is caused at said output stage, said driving circuit is formed of a transistor circuit including third and fourth transistors connected to said first and second transistors of said detecting circuit to turn on following said first and second transistors, and said control signal cut-off circuit including fifth and sixth transistors connected to the third and fourth transistors of said driving circuit to turn on following said third and fourth transistors, thereby cutting off said supply voltage control signal from said control circuit.

4. A protective device according to claim 2, wherein said power circuit has two, positive and negative variable power sources, said detecting circuit is formed of a transistor circuit including a first transistor connected to an output stage of said amplifier to turn on when a positive DC output voltage is produced at said output stage, a second transistor connected to the output stage to turn on when a negative DC output voltage is produced at said output stage, said second transistor connected in series with said first transistor, and a third transistor connected in parallel with said first and second transistors, said driving circuit is formed of a transistor circuit including fourth and fifth transistors connected to the first and third transistors of said detecting circuit to turn on following said first and third transistors, and a sixth transistor connected to said fourth transistor to turn on following said fourth transistor, and said control signal cut-off circuit is formed of a transistor circuit including seventh and eighth transistors connected to the fifth and sixth transistors of said driving circuit to turn on following said fifth and sixth transistors, thereby cutting off the supply voltage control signal from said control circuit.

5. A protective device according to claim 2, wherein said power circuit has two, positive and negative variable power sources, said control circuit is formed of a first comparator for comparing said input signal and a positive reference voltage and, so as to produce a positive/negative supply voltage control signal for controlling the positive supply voltage from said power circuit to increase when said positive reference voltage is smaller than said input signal or to decrease when said positive reference voltage is larger than said input signal, and a second comparator for comparing said input signal and a negative reference voltage to produce a control signal for controlling the negative voltage from said power circuit to increase when said negative reference voltage is smaller than said input signal or to decrease when said negative reference voltage is larger than said input signal, said detecting circuit is formed of a transistor circuit including a first transistor coupled to the output stage of said amplifier to turn on when a positive DC output voltage is generated at said output stage, a second transistor connected in series with said first transistor to turn on when a negative DC output voltage is produced at the output stage, and a third transistor connected in parallel with said first and second transistors, said driving circuit is formed of a transistor circuit including fourth, and fifth transistors connected to the first and third transistors to turn on following said first and third transistors, and a sixth transistor connected to said fourth transistor to turn on following said fourth transistor, and said control signal cut-off circuit is formed of a transistor circuit including seventh and eighth transistors connected to said fifth and sixth transistors of said driving circuit to turn on following said fifth and sixth transistors, thereby cutting off the positive/negative supply voltage control signal from said control circuit.

6. A protective device according to claim 2, wherein said detecting circuit is formed of a transistor circuit including a first transistor connected to the output stage of said amplifier to turn on when a positive DC output voltage is produced at said output stage, a second transistor connected in series with said first transistor to turn on when a negative DC output voltage is produced at said output stage, and a third transistor connected in parallel with said first and second transistors, said driving circuit is formed of a transistor circuit including a fourth and fifth transistor connected to the first and third transistors of said detecting circuit to turn on following said first and third transistors, and said control signal cut-off circuit is formed of a transistor circuit including fifth and sixth transistors connected to the fourth transistor of said driving circuit to turn off following said fourth transistor, thereby cutting off the bias to said control circuit so as to stop the supply voltage control signal from being supplied.

7. A protective device according to claim 2, wherein said detecting circuit is formed of a latch circuit including a first transistor connected to the output stage of said amplifier to turn on when a positive DC output voltage is produced at said output stage, a second transistor connected in series with said first transistor to turn on when a negative DC output voltage is produced at said output stage, a third transistor connected in parallel with said first and second transistors, and a flip-flop having fourth and fifth transistors connected to said first and third transistors so that one transistor is turned on, and the other transistor off when said DC output voltage is detected, and that such condition is kept, and said driving circuit is formed of a transistor circuit including a sixth transistor connected to the fifth transistor of said latch circuit so as to turn on when said fifth transistor is turned off.

8. A protective device according to claim 1, wherein said detecting means comprises a charge constant time circuit connected to said power circuit so as to detect a time lapse from a time when said power circuit is actuated, and a quick discharge circuit actuated when said power circuit is made inactive to discharge the charge in said charge time constant circuit quickly, said cut-off means comprises a driving circuit connected to said charge time constant circuit so as to be made in the off-condition upon power-on until a certain time determined by the time constant of said time constant circuit but made in the on-condition after lapse of the predetermined time, and upon power-off be quickly made in the off-state by said quick discharge circuit and charge circuit, and a switching control signal cut-off circuit connected between said driving circuit and said power circuit so as to be supplied via said driving circuit with a signal which said detecting circuit produces when detecting the on- and off-conditions of the power circuit, thus cutting off the switching control signal for said power circuit for said predetermined time.

9. A protective device according to claim 8, wherein said charge time constant circuit is formed of a resistor and capacitor connected to a fixed power source portion including a power switch for said power circuit, said quick discharge circuit is formed of a capacitor connected to the fixed power source portion of said power circuit, a first discharge circuit for instantly discharging the charge in said capacitor upon power-off, and a second discharge circuit including a transistor connected to said first discharge circuit to turn on by discharge of the capacitor of the quick discharge circuit, thereby permitting the charge in said charge time constant circuit to be quickly discharged, said driving circuit is formed of a transistor circuit connected to the capacitor of said charge time constant circuit to turn on after a predetermined time depending on the resistor and capacitor of the charge time constant circuit from turning-on of power source and turn off quickly following the discharge of said quick discharge circuit upon power-off, and said control signal cut-off circuit is formed of a transistor circuit including first and second transistors connected to said transistor circuit so as to turn on when said transistor circuit is inactive, thereby cutting off the supply voltage control signal from said control circuit.

10. A protective device according to claim 8, wherein said charge time constant circuit is formed of a circuit including a resistor and capacitor connected to the fixed power source portion including the power switch of said power circuit, said quick discharge circuit is formed of a capacitor connected to the fixed power source portion of said power circuit, a first discharge circuit permitting the charge in said capacitor to discharge instantly, and a second discharge circuit including a transistor connected to said first discharge circuit so as to turn on by the discharge of the capacitor of said quick discharge circuit, permitting the charge of the capacitor of the charge time constant circuit to be quickly discharged, said driving circuit is formed of a transistor circuit connected to the capacitor of the charge time constant circuit so as to turn on after a certain time determined by the resistor and capacitor of the charge time constant circuit from turning-on of power, and quickly turn off following the discharge of said quick discharge circuit upon power-off, and said control signal cut-off circuit is formed of a transistor circuit including a transistor connected to said transistor so as to turn off when said transistor is in the off-state, thereby cutting off the supply voltage control signal of said control circuit, and a Zener diode constituting part of a constant current circuit for determining the shift voltage of said control circuit together with said transistor.

11. A protective device according to claim 8, wherein said charge time constant circuit is formed of a circuit including a resistor and capacitor connected to the fixed power source portion including the power switch of said power circuit, said quick discharge circuit is formed of a capacitor connected to the fixed power source portion of said power circuit, a first discharge circuit for instantly discharging the charge in said capacitor upon power-off, and a second discharge circuit including a transistor connected to said first discharge circuit to turn on by the discharge of the capacitor of said quick discharge circuit, thereby permitting the charge in the first capacitor of said charge time constant circuit to be quickly discharged, said driving circuit is formed of a transistor circuit connected to the capacitor of said charge time constant circuit to turn on after a certain time determined by said resistor and capacitor upon power-on and quickly turn off following the discharge of said quick discharge circuit upon power-off, and said control signal cut-off circuit is formed of a transistor circuit including a first transistor connected to said transistor circuit so as to turn off when said transistor circuit is turned off, thereby cutting off the supply voltage control signal from the control circuit, and a second transistor connected to a signal transmission path between said transistor circuit and said amplifier so as to turn on when said transistor circuit is turned off, thereby cutting off part of said signal transmission path.

* * * * *